(12) United States Patent
Sears

(10) Patent No.: US 9,171,694 B2
(45) Date of Patent: Oct. 27, 2015

(54) ASYMMETRIC ELECTROSTATIC QUADRUPOLE DEFLECTOR FOR IMPROVED FIELD UNIFORMITY

(71) Applicant: KLA-Tencor Corporation, Milpitas, CA (US)

(72) Inventor: Christopher Sears, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/532,805

(22) Filed: Nov. 4, 2014

(65) Prior Publication Data

US 2015/0144785 A1 May 28, 2015

Related U.S. Application Data

(60) Provisional application No. 61/909,239, filed on Nov. 26, 2013.

(51) Int. Cl.
*H01J 37/147* (2006.01)
*H01J 37/141* (2006.01)
*H01J 37/12* (2006.01)
*H01J 37/153* (2006.01)
*H01J 37/10* (2006.01)

(52) U.S. Cl.
CPC .............. *H01J 37/1472* (2013.01); *H01J 37/10* (2013.01); *H01J 37/153* (2013.01); *H01J 2237/10* (2013.01); *H01J 2237/1516* (2013.01); *H01J 2237/2448* (2013.01); *H01J 2237/2602* (2013.01)

(58) Field of Classification Search
USPC ...... 250/307, 310, 311, 396 R, 396 ML, 398, 250/492.3
See application file for complete search history.

(56) References Cited

U.S. PATENT DOCUMENTS

| 2003/0075606 A1* | 4/2003 | Connolly et al. ........ 235/472.01 |
| 2003/0075686 A1 | 4/2003 | Adamec |
| 2007/0075262 A1* | 4/2007 | Winkler et al. ............... 250/398 |
| 2012/0205537 A1* | 8/2012 | Jiang ............................ 250/307 |
| 2013/0112889 A1* | 5/2013 | Chen et al. ............. 250/396 ML |
| 2015/0144785 A1* | 5/2015 | Sears .................. H01J 37/1472 |

FOREIGN PATENT DOCUMENTS

JP 10-302691 A 11/1998

OTHER PUBLICATIONS

PCT Search Report for Application No. PCT/US2014/066915, Mail dated Mar. 13, 2015. 13 pages.

* cited by examiner

*Primary Examiner* — Bernard E Souw
(74) *Attorney, Agent, or Firm* — Suiter Swantz pc llo

(57) ABSTRACT

An electron beam device for inspecting a target substrate or specimen thereon includes a beam separator with an asymmetric quadrupole electrostatic deflector for improving field uniformity for a single direction of deflection. The asymmetric quadrupole electrostatic deflector includes two orthogonal electrode plates spanning roughly 60 degrees and two electrode plates spanning roughly 120 degrees, the two latter plates defining a unidirectional deflection field. The device generates a primary electron beam and focuses the primary electron beam along an optical axis into the target substrate. Secondary electrons detected at the target substrate are focused into a secondary electron beam. The beam separator with asymmetric quadrupole electrostatic deflector deflects the secondary electron beam away from the axis of the primary electron beam in the direction of deflection and into a detector array.

22 Claims, 5 Drawing Sheets

ASYMMETRIC ELECTROSTATIC QUADRUPOLE DEFLECTOR FOR IMPROVED FIELD UNIFORMITY

CROSS-REFERENCE TO RELATED APPLICATIONS

This application claims priority under 35 U.S.C. §119(e) to provisional patent application U.S. Ser. No. 61/909,239 filed on Nov. 26, 2013. Said application is hereby incorporated by reference herein in its entirety.

TECHNICAL FIELD

Embodiments of the present disclosure relate generally to electron optic devices utilizing focused electron beams and particularly to electrostatic deflectors therefor.

BACKGROUND

Electron beam (e-beam) devices, such as e-beam defect review (eDR) instruments, are utilized for inspection or review of a target substrate, or a specimen held by the substrate. E-beam devices can include a beam separator having one or more electrostatic deflectors for deflecting a beam of primary electrons away from an optical axis normal to the substrate, or for redirecting a deflected beam into the optical axis. Electrostatic deflectors apply a voltage to multiple electrodes, thereby generating an electric field for deflecting the beam. Commonly known in the art for electrostatic deflection is the symmetric quadrupole, in which four electrode plates are spaced 90 degrees apart for deflection of the beam in either an X-direction or a Y-direction. For example, voltages $+V_x$ and $-V_x$ can be applied to the first and third electrodes respectively (the first and third plates opposed on the X-axis). Similarly, voltages $+V_y$ and $-V_y$ can be applied to the second and fourth electrodes respectively (the second and fourth plates opposed on the Y-axis).

However, an electrostatic deflector of symmetric-quadrupole configuration may not provide optimal uniformity of the electric field. Poor field uniformity may lead in turn to image degradation and performance loss in eDR use cases. An octopole electrostatic deflector, having four pairs of opposing electrodes rather than two, may provide better field uniformity than a symmetric quadrupole. However, the added complexity of the octopole requires eight voltage channels, where the symmetric quadrupole requires only four, rendering the octopole more expensive to manufacture. It may therefore be desirable to provide a more uniform deflection field while simplifying the overall system architecture of the e-beam device.

SUMMARY

Embodiments of the present invention concern an asymmetric quadrupole electrostatic deflector having a first pair of plates including a first plate and a second plate, the first plate and the second plate each spanning a radial angle less than 60 degrees, the at least one electrostatic deflector also having a second pair of plates including a third plate and a fourth plate, the third plate and the fourth plate each adjacent to the first plate and the second plate and each spanning a radial angle greater than that of the first and second plates.

Other embodiments of the present invention concern an electron beam device (ex.—defect review device, electron optic system) that improves electric field uniformity through use of an asymmetric quadrupole electrostatic deflector. In an illustrative embodiment, an electron beam apparatus for inspection of a target substrate includes an electron source for generating a primary electron beam. In one embodiment, the apparatus includes objective lenses for focusing the primary electron beam onto a target substrate. In an illustrative embodiment, the apparatus includes a beam separator for separating the primary electron beam from a secondary electron beam. In an illustrative embodiment, the beam separator includes an asymmetric quadrupole electrostatic deflector having a cylindrical insulator. In an illustrative embodiment, the asymmetric quadrupole electrostatic deflector has a first pair of plates including a first plate and a second plate, the first plate and the second plate each spanning a radial angle less than 60 degrees, the at least one electrostatic deflector also having a second pair of plates including a third plate and a fourth plate, the third plate and the fourth plate each adjacent to the first plate and the second plate and each spanning a radial angle greater than that of the first and second plates. In an illustrative embodiment, the apparatus includes a detector for receiving the secondary electron beam.

Other embodiments of the present invention concern a method for inspecting a target substrate via an electron beam device. In an illustrative embodiment, the device generates a primary electron beam. In an illustrative embodiment, the primary electron beam is then focused onto a portion of the target substrate. In an illustrative embodiment, the secondary electron beam is then deflected away from the target substrate and away from the primary electron beam (ex.—optical axis) via at least one beam separator including at least one asymmetric quadrupole electrostatic deflector, the at least one asymmetric quadrupole electrostatic deflector having a first pair of plates including a first plate and a second plate, the first plate and the second plate each spanning a radial angle less than 60 degrees, the at least one asymmetric quadrupole deflector also having a second pair of plates including a third plate and a fourth plate, the third plate and the fourth plate each adjacent to the first plate and the second plate and each spanning a radial angle greater than that of the first plate and the second plate, the secondary electron beam being deflected along a plane defined by the second pair of plates. For example, the radial angle spanned by each of the second pair of plates may be twice the radial angle spanned by each of the first pair of plates. In an illustrative embodiment, the secondary electron beam is then detected via at least one detector.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The advantages of the invention may be better understood by those skilled in the art by reference to the accompanying figures in which.

DETAILED DESCRIPTION

Figure 1A:
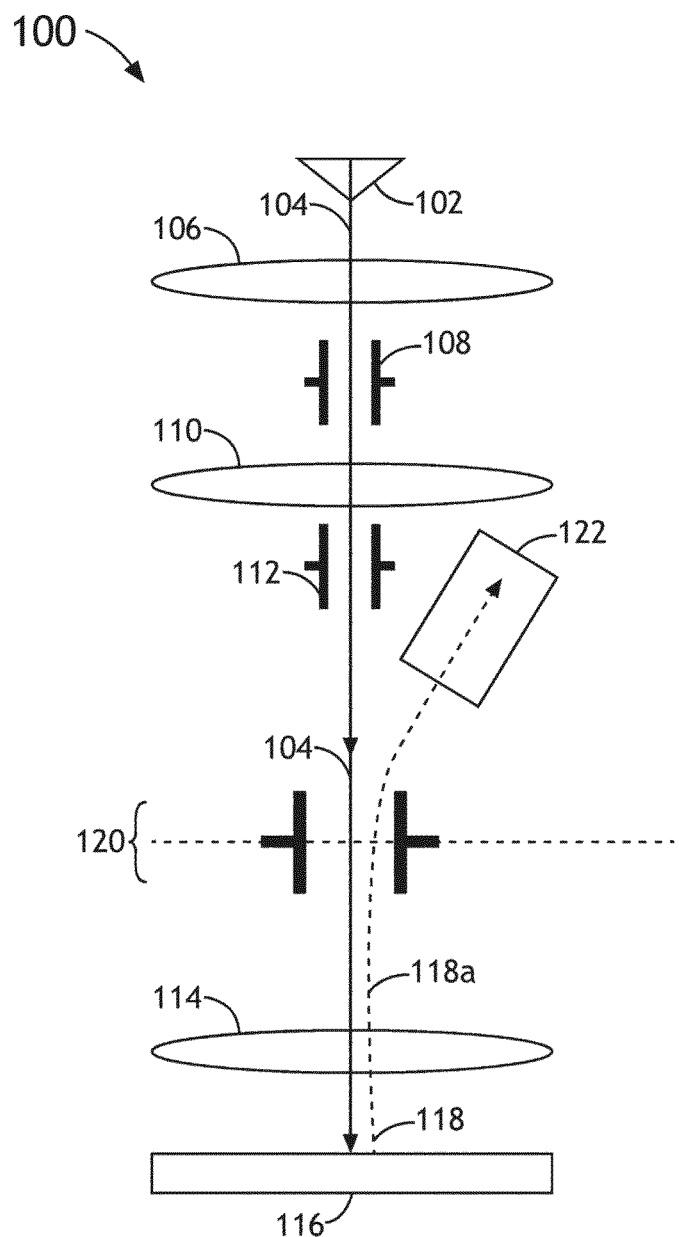
FIG. 1A is a diagrammatic illustration of an embodiment of an electron beam device according to the present disclosure.

Features of the present invention in its various embodiments are exemplified by the following descriptions with reference to the accompanying drawings, which describe the present invention with further detail. These drawings depict only selected embodiments of the present invention, and should not be considered to limit its scope in any way.

FIGS. 1A-3 illustrate a system and method for inspection of a target substrate 116 via an electron beam device 100 including a beam separator 120 having an electrostatic deflector 124 of asymmetric quadrupole configuration. In one embodiment, the asymmetric quadrupole electrostatic deflector 124 provides greater field uniformity than a symmetric quadrupole (and a corresponding improvement in overall system performance). In one embodiment, the asymmetric quadrupole electrostatic deflector 124 provides greater field uniformity without the added system complexity and added cost of an octopole electrostatic deflector. In one embodiment, the asymmetric quadrupole electrostatic deflector 124 generates a deflection field in only a single direction defined by opposing electrode plates 128b and 128d.

FIG. 1 depicts an electron beam device (ex.—electron optic system) 100 according to embodiments of the present disclosure. In one embodiment, the beam separator 120 of electron beam device 100 utilizes an electrostatic deflector 124 of asymmetric quadrupole configuration. In one embodiment, the asymmetric configuration of electrostatic deflector 124 generates a unidirectional deflection field as opposed to the bidirectional deflection field generated by a symmetric quadrupole (i.e., four uniformly sized electrode plates spaced at 90-degree intervals). In one embodiment, the asymmetric quadrupole electrostatic deflector 124 deflects a secondary electron beam 118a separated from the optical axis of electron beam device 100 (i.e., the primary electron beam 104) by beam separator 120. In one embodiment, the asymmetric quadrupole electrostatic deflector 124 of beam separator 120 deflects the separated secondary electron beam 118a into a detector array 122.

In one embodiment, electron beam device 100 includes an electrode source 102. In one embodiment, the electrode source 102 generates a primary electron beam 104. For example, electron source 102 may include, but is not limited to, an electron gun, an electron emitter, or a photocathode. In one embodiment, electrode source 102 generates a single primary electron beam 104. It is contemplated, however, that the present invention may be extended to a multi-beam configuration. In another embodiment, electron source 102 may emit free electrons that are collimated into primary electron beam 104 by one or more condenser lenses or collimators 106. In one embodiment, primary electron beam 104 is directed along the optical axis (ex.—center axis) of electron beam device 100 through beam-current selection aperture 108, transfer lens 110, and pre-scanner 112.

Figure 1B:
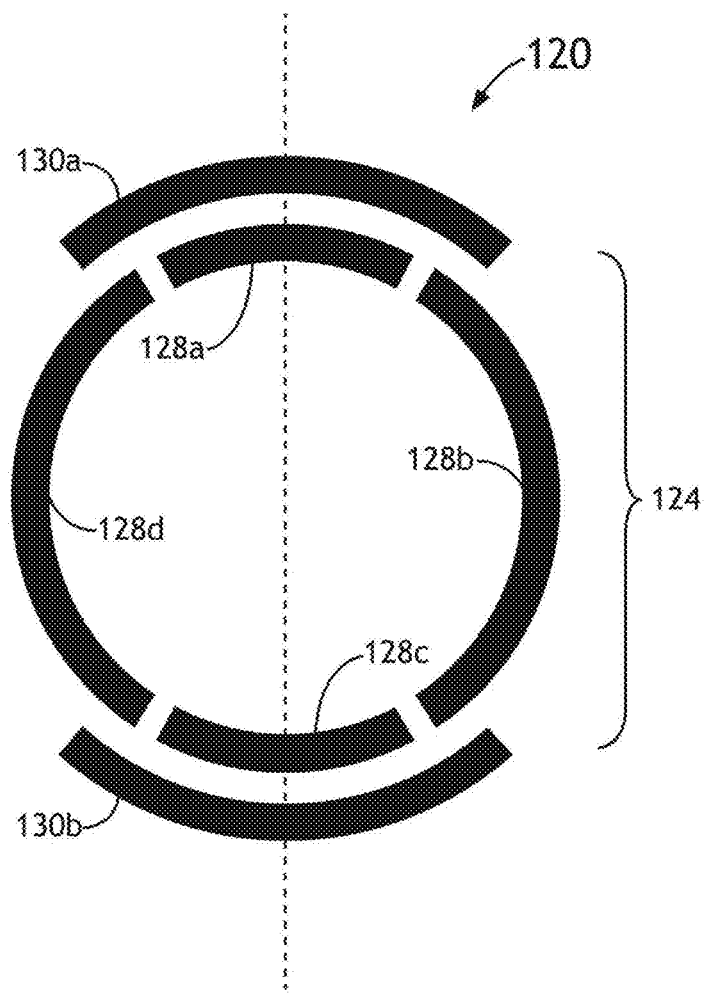
FIG. 1B is a diagrammatic illustration of an embodiment of an electrostatic deflector according to the present disclosure.

Referring to FIG. 1B, in one embodiment, beam separator 120 includes an asymmetric quadrupole electrostatic deflector 124 fixed to a cylindrical insulator 126. In one embodiment, asymmetric quadrupole electrostatic deflector 124 includes orthogonal plates 128a, 128c and deflection plates 128b, 128d. In one embodiment, orthogonal plates 128a and 128c are grounded (not used for deflection) and associated with excitation coils 130a and 130b respectively. In one embodiment, asymmetric quadrupole electrostatic deflector 124 can generate an electric deflection field via application of voltage to deflection plates 128b, 128d. In another embodiment, beam separator 120 is configured as a Wien filter.

In one embodiment, objective lens 106 focuses primary electron beam 104 over a portion of target substrate 116. In one embodiment, primary electron beam 104 strikes target substrate 116 at an angle normal to target substrate 116, producing secondary (ex.—scattered) electrons 118 . In one embodiment, objective lens 114 filters a portion of secondary electrons 118 into a secondary electron beam 118a. In one embodiment, secondary electron beam 118a then passes through beam separator 120. In one embodiment, asymmetric quadrupole electrostatic deflector 124 then deflects secondary electron beam 118a away from the optical axis of device 100, defined by primary electron beam 104. In one embodiment, asymmetric quadrupole electrostatic deflector 124 deflects secondary electron beam 118a into secondary electron detector array (ex.—detector system) 122.

Figure 2A:
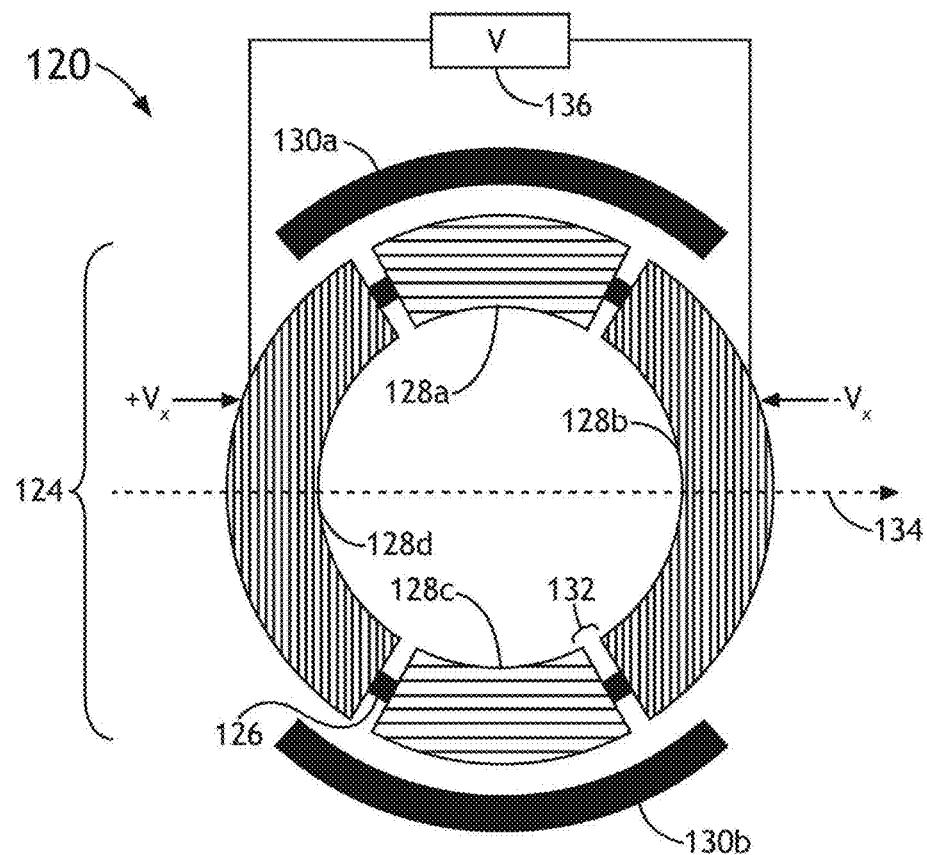
FIGS. 2A and 2B are diagrammatic illustrations of an embodiment of an electrostatic deflector according to the present disclosure.
Figure 2B:
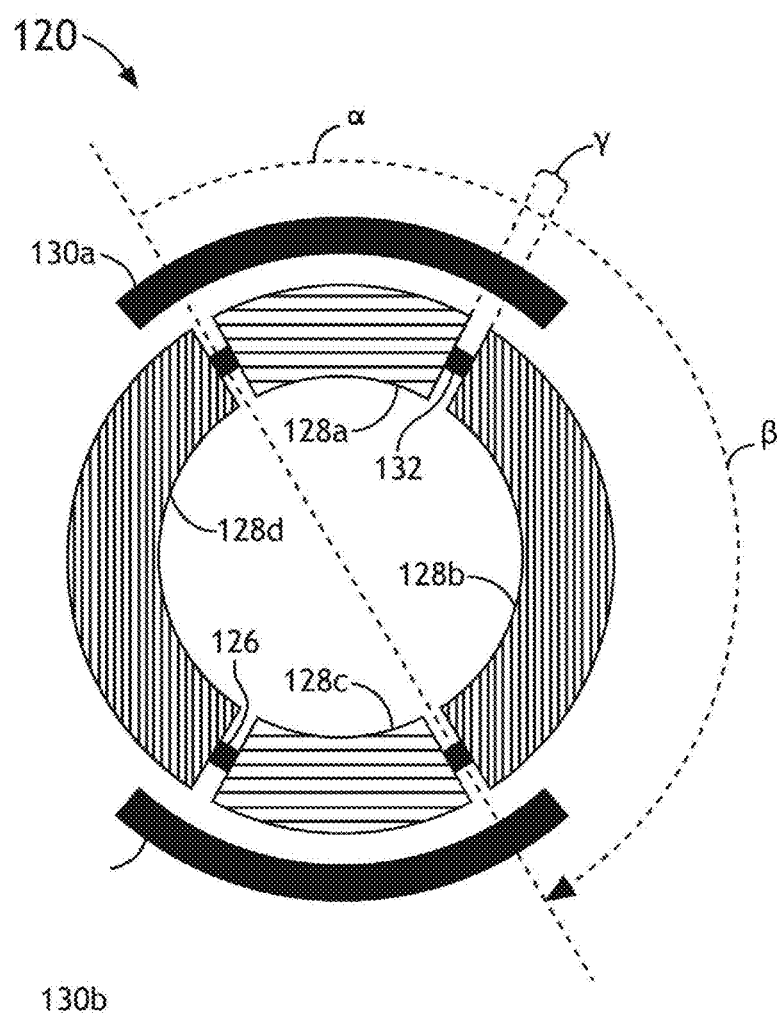

Referring to FIGS. 2A and 2B, in one embodiment, asymmetric quadrupole electrostatic deflector 124 provides a more uniform deflection field than a standard symmetric quadrupole. In one embodiment, asymmetric quadrupole electrostatic deflector 124 deflects a secondary electron beam 118a in a single direction 134, rather than in an X-direction or a Y-direction as would a standard symmetric quadrupole. In one embodiment, asymmetric quadrupole deflector 124 includes a pair of orthogonal plates 128a, 128c and a pair of plates 128b, 128d oriented in the direction of deflection 134. In one embodiment, plates 128a, 128b, 128c and 128d are fixed to a cylindrical insulator 126. In one embodiment, when voltage $+V_x$ is applied to plate 128d and voltage $+V_x$ is applied to plate 128b, secondary electron beam 118a is deflected by the resulting field along a plane defined by the direction of deflection 134.

Referring to FIG. 2B, in one embodiment orthogonal plates 128a and 128c each span a radial angle $\alpha$ of less than 60 degrees, while deflection plates 128b and 128d each span a radial angle $\beta$ greater than radial angle $\alpha$. In one embodiment, radial angle $\beta$ is twice radial angle $\alpha$. For example, radial angle $\alpha$ may span between 58 and 60 degrees and radial angle $\beta$ may span between 116 and 120 degrees. In one embodiment, orthogonal plates 128a, 128c each span a radial angle less than 60 degrees to allow for gaps 132 between adjacent plates 128 of the asymmetric quadrupole electrostatic deflector 124. In one embodiment, adjacent plates 128a-128b, 128b-128c, 128c-128d, and 128d-128a are separated by four uniform gaps 132. In one embodiment, the precise width of gaps 132 varies according to the width of orthogonal plates 128a, 128c and deflection plates 1268, 128d. For example, as shown in FIG. 2B, gaps 132 may span a radial angle $\gamma$ of up to 3 degrees each; notwithstanding the precise width of gaps 132 (radial angle $\gamma$), deflection plates 128b and 128d may span a radial angle $\beta$ twice the radial angle $\alpha$ spanned by orthogonal plates 128a and 128c.

Figure 3:
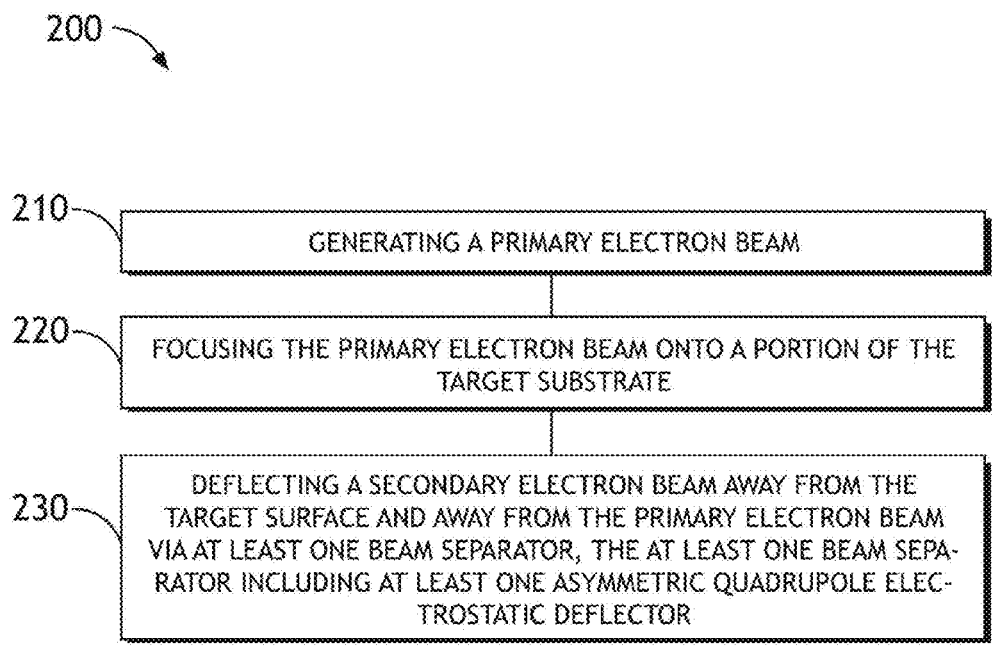
FIG. 3 is a process flow diagram of a method for inspecting a target substrate according to embodiments of the present disclosure.

FIG. 3 illustrates a process flow diagram of a method 200 for inspecting a target substrate or specimen thereon according to an embodiment of the present invention. It is noted herein that the method 200 can be carried out utilizing any of the embodiments described previously. It is further noted, however, that method 200 is not limited to the components or configurations described previously as multiple components and/or configurations can be suitable for executing method 200.

At step 210, the method 200 generates a primary electron beam 104. For example, as shown in FIG. 1A, electron source 102 may generate a primary electron beam 102. In one embodiment, one or more condenser lenses or collimators 106 condense free electrons into a primary electron beam 104. At step 220, the method 200 focuses the primary electron beam 104 onto a portion of the target substrate 116. For example, as shown in FIG. 1A, objective lens 114 may focus primary electron beam 104 onto a portion of the target substrate 116. At step 230, the method 200 deflects a secondary electron beam 118a away from the target substrate 116 and away from the primary electron beam 104. For example, as shown in FIGS. 1A and 1B, at least one beam separator 120 may deflect a secondary electron beam 118a away from the target substrate 116 and away from the primary electron beam 104 via an asymmetric quadrupole electrostatic deflector 124. As shown in FIG. 1B, orthogonal plates 128a, 128c of asymmetric quadrupole electrostatic deflector 124 may be grounded and associated with coils 130a and 130b respectively. As shown in FIG. 2A, a voltage source 136 may apply a first voltage $+V_x$ to a deflection plate 128d of asymmetric quadrupole electrostatic deflector 124. As shown in FIG. 2A, voltage source 136 may apply a second voltage $-V_x$ to the opposing deflection plate 128b of asymmetric quadrupole electrostatic deflector 124. As shown in FIG. 2A, the secondary electron beam 118a may be deflected in direction 134 along a plane defined by a pair of deflection plates 128d, 128b of asymmetric quadrupole electrostatic deflector 124. In one embodiment, the method 200 additionally detects the secondary electron beam via at least one detector. For example, as shown in FIG. 1A, detector 122 may detect a secondary electron beam 118a deflected by beam separator 120. In one embodiment, the method 200 additionally detects backscattered electrons from the target substrate 116 via an additional detector. In one embodiment, the method 200 detects transmitted electrons from the target substrate 116 via an additional detector.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

I claim:

1. An asymmetric quadrupole electrostatic deflector, comprising:
   a first pair of plates including a first plate and a second plate, the first plate and the second plate each spanning a first radial angle; and
   a second pair of plates including a third plate and a fourth plate, the third plate and the fourth plate each adjacent to the first plate and the second plate and each spanning a second radial angle greater than the first radial angle.

2. The deflector of claim 1, wherein the second radial angle is twice the first radial angle.

3. The deflector of claim 1, further comprising:
   a plurality of gaps including at least a first gap separating the first plate from the third plate, a second gap separating the third plate from the second plate, a third gap separating the second plate from the fourth plate, and a fourth gap separating the fourth plate from the first plate, each gap of the plurality of gaps spanning a third radial angle.

4. The deflector of claim 3, wherein the first radial angle is between 58 and 60 degrees, the second radial angle is between 116 and 120 degrees, and the third radial angle is between zero and 3 degrees.

5. The deflector of claim 1, wherein at least one of the first pair of plates is grounded.

6. The deflector of claim 1, wherein at least one plate of the first pair of plates and the second pair of plates is an electrode plate.

7. The deflector of claim 1, further comprising:
   at least one cylindrical insulator connected to the first pair of plates and to the second pair of plates.

8. A method for inspecting a target substrate, comprising:
   generating a primary electron beam;
   focusing the primary electron beam onto a portion of the target substrate; and
   deflecting a secondary electron beam away from the target substrate and away from the primary electron beam via at least one beam separator, the at least one beam separator including at least one asymmetric quadrupole electrostatic deflector having a first pair of plates including a first plate and a second plate, the first plate and the second plate each spanning a first radial angle, the at least one asymmetric quadrupole deflector also having a second pair of plates including a third plate and a fourth plate, the third plate and the fourth plate each adjacent to the first plate and the second plate and each spanning a second radial angle greater than the first radial angle, the secondary electron beam being deflected along a plane defined by the second pair of plates.

9. The method of claim 8, wherein the deflecting a secondary electron beam away from the target substrate and away from the primary electron beam via at least one beam separator, the at least one beam separator including at least one asymmetric quadrupole electrostatic deflector includes:
   applying a first voltage $+V_x$ to the fourth plate of the at least one electrostatic deflector;
   applying a second voltage $-V_x$ to the third plate of the at least one electrostatic deflector; and
   deflecting the secondary electron beam along a plane defined by the second pair of plates of the at least one electrostatic deflector.

10. The method of claim 8, wherein the at least one beam separator is configured as a Wien filter.

11. The method of claim 8, further comprising:
    detecting the secondary electron beam via at least one first detector.

12. The method of claim 8, further comprising:
    detecting one or more backscattered electrons via at least one second detector.
13. The method of claim 8, further comprising:
    detecting one or more transmitted electrons via at least one third detector.
14. An electron beam apparatus for inspection of a target substrate, comprising:
    an electron source configured to generate a primary electron beam;
    at least one objective lens configured to focus the primary electron beam onto the target substrate; and
    at least one beam separator configured to separate the primary electron beam from a secondary electron beam, the at least one beam separator including at least one electrostatic deflector having a first pair of plates including a first plate and a second plate, the first plate and the second plate each spanning a first radial angle, the at least one electrostatic deflector also having a second pair of plates including a third plate and a fourth plate, the third plate and the fourth plate each adjacent to the first plate and the second plate and each spanning a second radial angle greater than the first radial angle;
    at least one voltage source configured to apply a first voltage $+V_x$ to the at least one fourth plate and to apply a second voltage $-V_x$ to the at least one third plate; and
    at least one detector configured to receive the secondary electron beam.
15. The apparatus of claim 14, wherein the second radial angle is twice the first radial angle.
16. The apparatus of claim 14, wherein the at least one electrostatic deflector includes
    a plurality of gaps including at least a first gap separating the first plate from the third plate, a second gap separating the third plate from the second plate, a third gap separating the second plate from the fourth plate, and a fourth gap separating the fourth plate from the first plate, each gap of the plurality of gaps spanning a third radial angle.
17. The apparatus of claim 16, wherein the first radial angle is between 58 and 60 degrees, the second radial angle is between 116 and 120 degrees, and the third radial angle is between zero and 3 degrees.
18. The apparatus of claim 14, wherein at least one plate of the first pair of plates is grounded.
19. The apparatus of claim 14, wherein the at least one beam separator is configured as a Wien filter.
20. The apparatus of claim 14, further comprising:
    at least a first pair of coils associated with the first pair of plates, the at least one pair of coils configured to generate a magnetic field.
21. The apparatus of claim 14, wherein at least one plate of the first pair of plates and the second pair of plates is an electrode plate.
22. The apparatus of claim 14, wherein the at least one electrostatic deflector includes
    at least one cylindrical insulator connected to the first pair of plates and to the second pair of plates.

* * * * *